(12) United States Patent
Hughes

(10) Patent No.: US 9,183,076 B2
(45) Date of Patent: Nov. 10, 2015

(54) USING CARRY-LESS MULTIPLICATION (CLMUL) TO IMPLEMENT ERASURE CODE

(71) Applicant: FutureWei Technologies, Inc., Plano, TX (US)

(72) Inventor: James Hughes, Palo Alto, CA (US)

(73) Assignee: Futurewei Technologies, Inc., Plano, TX (US)

( * ) Notice: Subject to any disclaimer, the term of this patent is extended or adjusted under 35 U.S.C. 154(b) by 237 days.

(21) Appl. No.: 13/866,453

(22) Filed: Apr. 19, 2013

(65) Prior Publication Data

US 2014/0317162 A1    Oct. 23, 2014

(51) Int. Cl.
| | |
|---|---|
| G06F 11/08 | (2006.01) |
| G06F 11/10 | (2006.01) |
| G06F 7/72 | (2006.01) |
| G06F 7/00 | (2006.01) |
| G06F 7/53 | (2006.01) |
| G06F 9/30 | (2006.01) |

(52) U.S. Cl.
CPC ............ *G06F 11/08* (2013.01); *G06F 7/00* (2013.01); *G06F 7/53* (2013.01); *G06F 7/724* (2013.01); *G06F 9/3001* (2013.01); *G06F 11/1076* (2013.01)

(58) Field of Classification Search
None
See application file for complete search history.

(56) References Cited

U.S. PATENT DOCUMENTS

| | | | | |
|---|---|---|---|---|
| 7,461,115 | B2 * | 12/2008 | Eberle et al. | ............... 708/491 |
| 2006/0282743 | A1 | 12/2006 | Kounavis | |
| 2006/0282744 | A1 | 12/2006 | Kounavis | |
| 2008/0240423 | A1 * | 10/2008 | Gueron et al. | ............... 380/28 |
| 2012/0150933 | A1 | 6/2012 | Boersma et al. | |

FOREIGN PATENT DOCUMENTS

CN        101185245 A        5/2008

OTHER PUBLICATIONS

J. S. Plank, K. M. Greenan, E. L. Miller, and W. B. Houston, "GF-Complete: A comprehensive open source library for Galois Field arithmetic", Technical Report UT-CS-13-703, University of Tennessee, Feb. 2013.*

A. G. Dimakis, V. Prabhakaran and K. Ramchandran "Decentralized erasure codes for distributed networked storage", Trans. Inf. Theory IEEE/ACM Trans. Netw., 2006.*

(Continued)

*Primary Examiner* — Chuong D Ngo
*Assistant Examiner* — Matthew Sandifer
(74) *Attorney, Agent, or Firm* — Slater & Matsil, L.L.P.

(57) ABSTRACT

Systems and methods for using carry-less multiplication (CLMUL) to implement erasure code are provided. An embodiment method of using CLMUL to implement erasure code includes initiating, with a processor, a first CLMUL call to calculate a first product of a data bit word and a constant, partitioning, with the processor, the first product into a high portion and a low portion, and initiating, with the processor, a second CLMUL call to calculate a second product of the high portion and a hexadecimal number portion, a bit size of the second product less than a bit size of the first product. The second product, or a third product generated by a third CLMUL call, is used to calculate a parity bit. Because the second product or the third product has a number of bits equivalent to the number of bits used by the processor, the erasure codes are more efficiently implemented.

18 Claims, 11 Drawing Sheets

(56) References Cited

OTHER PUBLICATIONS

B. Warner, Z. Wilcox-O'Hearn, and R Kinninmont, "Tahoe: A Secure Distributed Filesystem", Oct. 2011, retrieved from https://web.archive.org/web/20111005122626/http://tahoe-lafs.org/~warner/pycon-tahoe.html.*

S. Gueron, M. Kounavis, "Intel Carry-Less Multiplication Instruction and its Usage for Computing the GCM mode", Intel white paper, Revision 2.0, May 2010.*

M.O. Rabin, "Efficient Dispersal of Information for Security, Load Balancing and Fault Tolerance," J. ACM, vol. 36, No. 2, pp. 335-348, Apr. 1989.*

K. Greenan, E. Miller, and T. J. Schwartz, "Optimizing Galois Field arithmetic for diverse processor architectures and applications", In MASCOTS 2008: 16th IEEE Symposium on Modeling, Analysis and Simulation of Computer and Telecommunication Systems, Sep. 2008.*

J. Luo, K. D. Bowers, A. Oprea, and L. Xu, "Efficient software implementations of large finite fields GF(2n) for secure storage applications", ACM Transactions on Storage, 8(2), Feb. 2012.*

J. S. Plank, "A tutorial on Reed-Solomon coding for fault-tolerance in RAID-like systems", Software—Practice & Experience, 27(9):995-1012, Sep. 1997.*

J. S. Plank, K. M. Greenan, and E. L. Miller, "Screaming Fast Galois Field Arithmetic using Intel SIMD Instructions," in Proceedings of the 11th USENIX Conference on File and Storage Technologies (FAST), 2013.*

J. S. Plank, "Erasure Codes for Storage Systems: A Brief Primer," ;login: the Usenix Magazine, vol. 38, No. 6, Dec. 2013.*

International Search Report of the Patent Cooperation Treaty Patent Office received in International Patent Application No. PCT/CN2014/075766, mailed Aug. 5, 2014, 15 pages.

* cited by examiner

| 1 | 0 | 0 | 0 | 0 | 0 | 0 | 0 | 0 | 1 | a20 | a30 |
| 0 | 1 | 0 | 0 | 0 | 0 | 0 | 0 | 0 | 1 | a21 | a31 |
| 0 | 0 | 1 | 0 | 0 | 0 | 0 | 0 | 0 | 1 | a22 | a32 |
| 0 | 0 | 0 | 1 | 0 | 0 | 0 | 0 | 0 | 1 | a23 | a33 |
| 0 | 0 | 0 | 0 | 1 | 0 | 0 | 0 | 0 | 1 | a24 | a34 |
| 0 | 0 | 0 | 0 | 0 | 1 | 0 | 0 | 0 | 1 | a25 | a35 |
| 0 | 0 | 0 | 0 | 0 | 0 | 1 | 0 | 0 | 1 | a26 | a36 |
| 0 | 0 | 0 | 0 | 0 | 0 | 0 | 1 | 0 | 1 | a27 | a37 |
| 0 | 0 | 0 | 0 | 0 | 0 | 0 | 0 | 1 | 1 | a28 | a38 |
| 0 | 0 | 0 | 0 | 0 | 0 | 0 | 0 | 1 | 1 | a29 | a39 |

Fig. 7

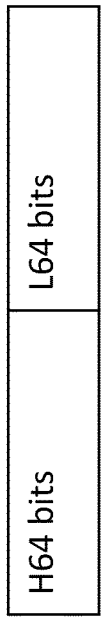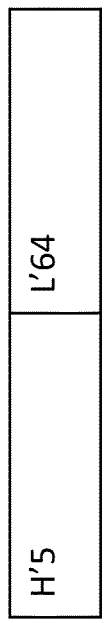

US 9,183,076 B2

USING CARRY-LESS MULTIPLICATION (CLMUL) TO IMPLEMENT ERASURE CODE

TECHNICAL FIELD

The present disclosure relates to distributed storage systems and, in particular embodiments, to distributed storage systems implementing error correcting codes.

BACKGROUND

In a distributed storage system, where the failure of an individual storage component may cause part of the stored data to be lost, replication of the stored data is a common technique used to reduce the impact of any storage component failure. Unfortunately, replication of the stored data comes at the cost of increased storage utilization. For example, making two copies of every stored data item will occupy twice as much storage space.

As an alternative to storing data twice, Reed Solomon error correcting codes (a.k.a., parity blocks) were developed to provide equivalent replication protect at a reduced storage usage cost. By way of example, a one (1) byte Reed Solomon error correcting code, which can be computed using a lookup table, may be used by software implementing a redundant array of independent disks (RAID) system in an effort to provide data redundancy. However, this solution often comes with a significant performance penalty.

SUMMARY

An embodiment method of using Carry-less Multiplication (CLMUL) to implement erasure code includes initiating, with a processor, a first CLMUL call to calculate a first product of a data bit word and a constant, partitioning, with the processor, the first product into a high portion and a low portion, and initiating, with the processor, a second CLMUL call to calculate a second product of the high portion and a hexadecimal number portion, a bit size of the second product less than a bit size of the first product.

An embodiment method of using Carry-less Multiplication (CLMUL) to implement erasure code including initiating, with a processor, a first CLMUL call to calculate a first product of a data bit word and a constant, partitioning, with the processor, the first product into a high portion and a low portion, initiating, with the processor, a second CLMUL call to calculate a second product of the high portion and a hexadecimal number portion, initiating, with the processor, a third CLMUL call to calculate a third product of the high portion and the hexadecimal number portion, a bit size of the third product less than a predetermined number of bits and less than a bit size of the first and second products, repeating the partitioning and initiating steps for a plurality of the data bit word and a plurality of the constants to generate a plurality of the third products, and performing an exclusive or (XOR) operation on the plurality of the third products to generate at least one parity bit word.

An embodiment server using Carry-less Multiplication (CLMUL) to implement erasure code includes a client interface configured to receive an instruction from a client to store data, and a processor in communication with the client interface. The processor is configured to perform the following in response to the instruction: initiate a first CLMUL call to calculate a first product of a data bit word and a constant, partition the first product into a high portion and a low portion, initiate a second CLMUL call to calculate a second product of the high portion and a hexadecimal number portion, a bit size of the second product less than a bit size of the first product, and initiate a third CLMUL call to calculate a third product of the high portion and the hexadecimal number portion, a bit size of the third product equal to a bit size used by the processor.

BRIEF DESCRIPTION OF THE DRAWINGS

For a more complete understanding of the present disclosure, and the advantages thereof, reference is now made to the following descriptions taken in conjunction with the accompanying drawing, in which:

FIG. 7 illustrates the lost data relative to the matrix of FIG. 4;

FIG. 10 illustrates how a first product of data and a random number is partitioned into a high portion and a low portion;

FIG. 11 illustrates how a second product may be partitioned into a high portion and a low portion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely servers operating in a universal distributed storage (UDS) system. The concepts in the disclosure may also apply, however, to other types of storage systems and associated computing devices and components.

Figure 1:
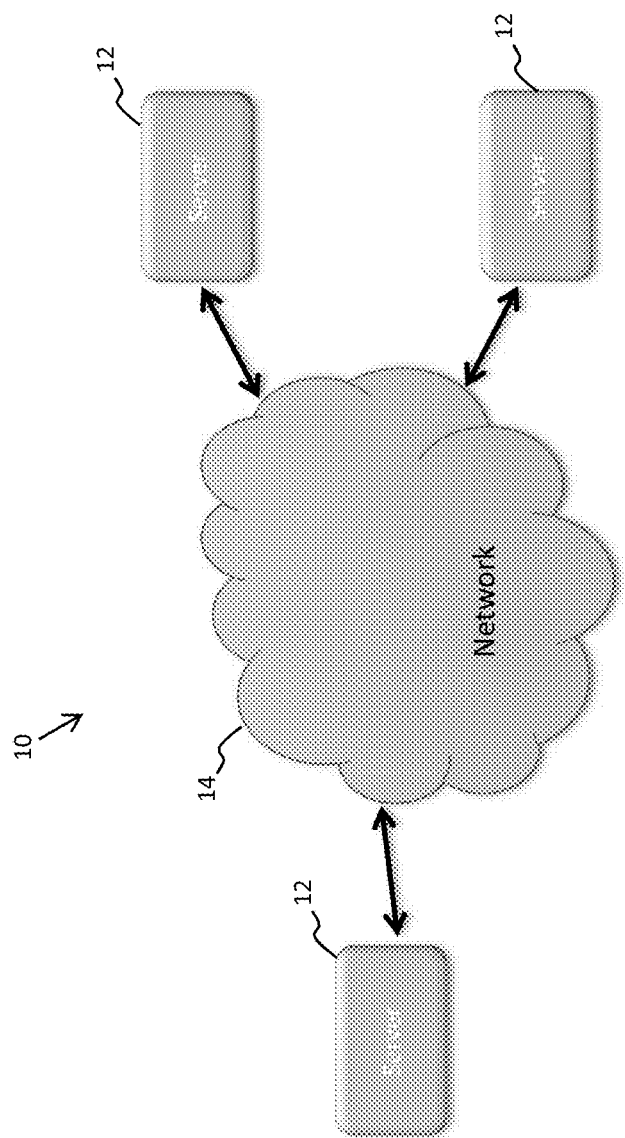
FIG. 1 illustrates an embodiment universal distributed storage (UDS) system.

Referring now to FIG. 1, an embodiment universal distributed storage (UDS) system 10 is illustrated. As shown, the embodiment UDS system 10 includes several servers 12 communicating through a network 14 (e.g., the Internet). It should be recognized that a practical application of the embodiment UDS system 10 may include components, devices, hardware, and so on, which have not been included in FIG. 1 for ease of illustration. In addition, the embodiment UDS system 10 may include more or fewer servers 12 than depicted in FIG. 1. Also, in an embodiment another type of computing or networked system, which is different from the UDS system 10, may incorporate and benefit from the concepts disclosed herein.

Figure 2:
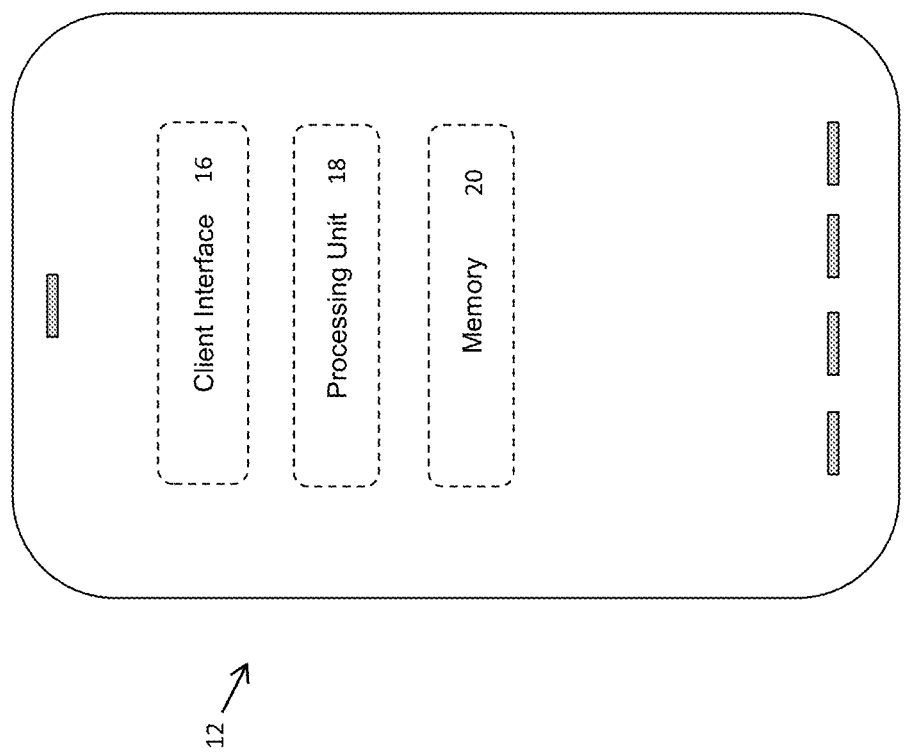
FIG. 2 illustrates a server from the storage system of FIG. 1.

Referring now to FIG. 2, an embodiment server 12 is illustrated in further detail. As shown, the server 12 includes a client interface 16, a processing unit 18, and a memory 20. In an embodiment, the client interface 16 is configured to facilitate communications with a client (e.g., a user of the UDS system 10, etc.). As such, the client interface 16 may generate a graphical user interface (GUI) or provide another type of input/output platform enabling the client to interact with the UDS system 10.

In an embodiment, the processing unit 18 may be more or more processors (e.g., central processing unit (CPU). or computational logic devices. As will be more fully explained below, the processing unit 18 is configured to carry out the instructions of a computer program by performing the basic arithmetical, logical, and input/output operations of the server 12 and/or the UDS system 10.

In an embodiment, the memory 20 comprises the physical device or devices used to store programs (e.g., sequences of instructions) or data (e.g., program state information) on a temporary or permanent basis for use in the server 12 or other digital electronic device. As will be more fully explained below, the memory 20 may take a variety of forms and formats.

Figure 3:
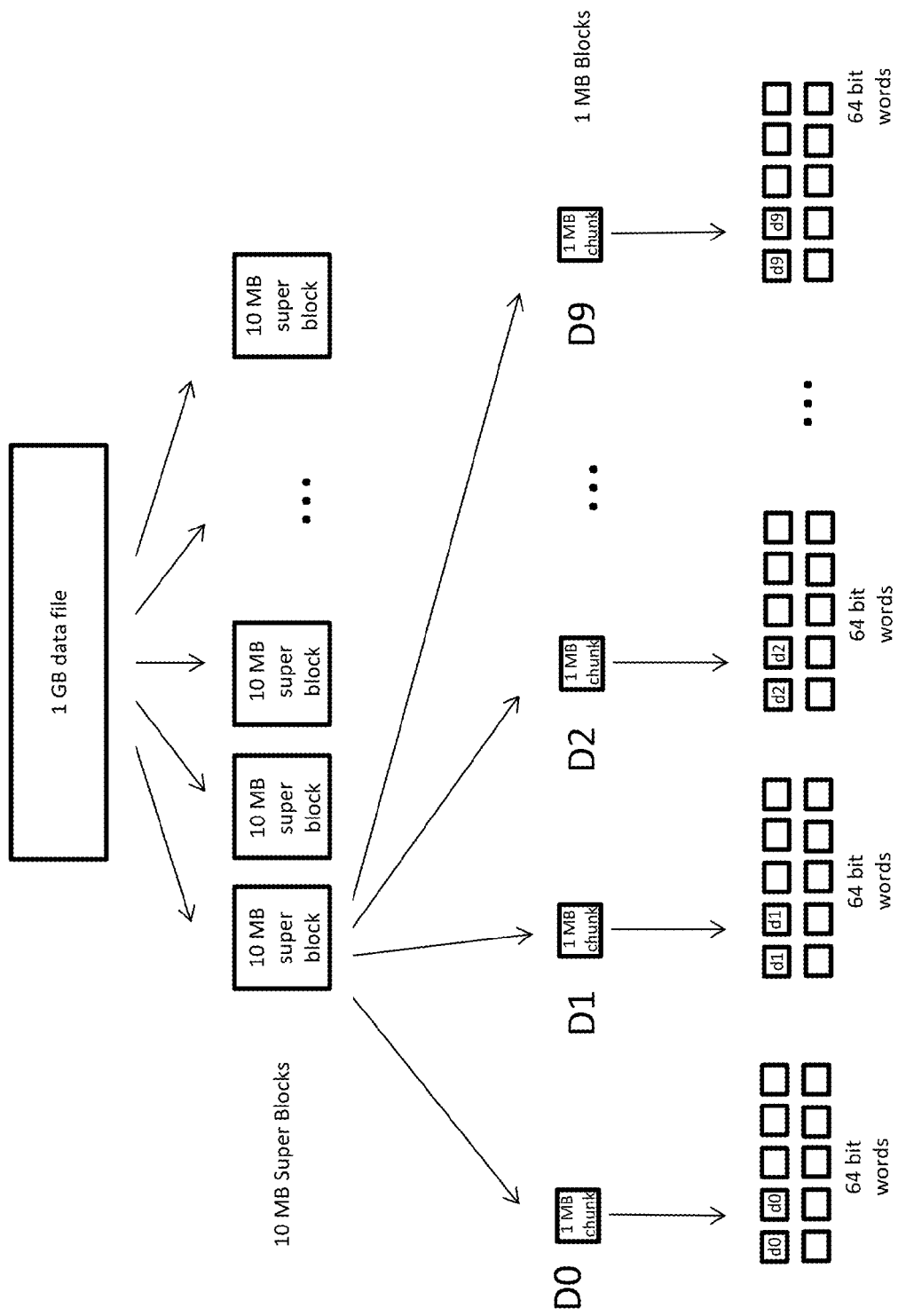
FIG. 3 illustrates a large data file broken into smaller chunks and blocks.

Referring now to FIG. 3, an example of how a data file (e.g., a video file, a photograph file, a document file, etc.) may be divided in preparation for storage at the request of a client. For purposes of illustration, the data file in FIG. 3 is a one (1) gigabyte (GB) data file. However, it should be recognized that the data file may be smaller or larger depending on the data to be stored.

To begin, a client requests that one of the servers 12 depicted in FIGS. 1-2 store the 1 GB data file (a.k.a., data). When the 1 GB data file is received, the server 12 breaks the data into manageable chunks such as, for example, ten (10) megabyte (MB) super blocks. For ease of illustration, only a few of the ten 10 MB superblocks are illustrated in FIG. 3. However, it should be recognized that the entire 1 GB data file will be divided into 10 MB superblocks.

After the 1 GB data file has been divided into super blocks, each of the 10 MB super blocks is further divided into one (1) megabyte (MB) blocks as shown in FIG. 3. This accommodates for the tendency of entire blocks (a.k.a., chunks) to be lost with a Reed-Solomon erasure code. For ease of illustration, only one of the 10 MB super blocks has been shown divided into one (1) megabyte (MB) blocks. However, it should be understood that each of the 10 MB super blocks are so divided.

Figure 4:
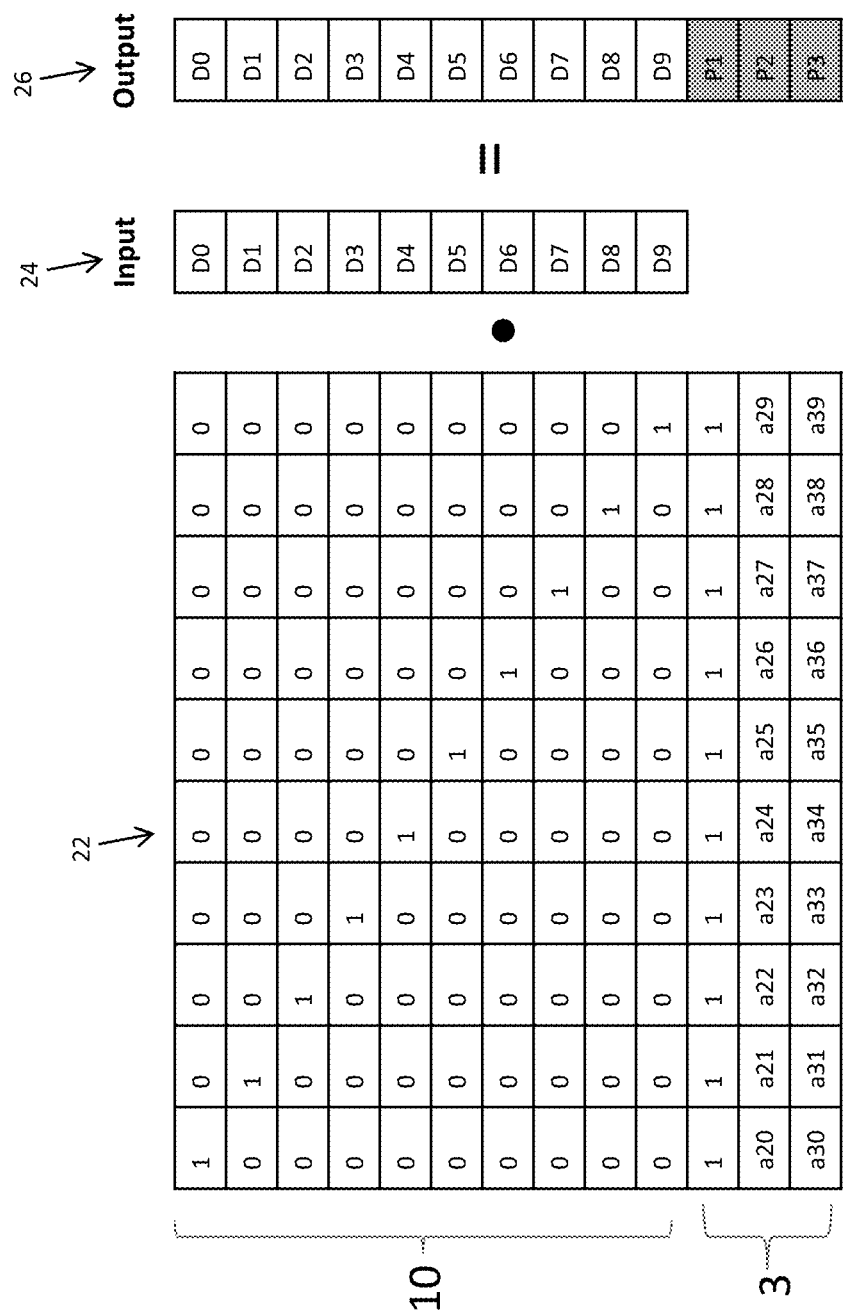
FIG. 4 illustrates a matrix used to generate parity bits from an input, the parity bits available to recover lost data.

Referring now to FIG. 4, after each of the 10 MB super blocks is has been divided into 1 MB blocks as shown in FIG. 3, in a conventional UDS system three 1 MB parity blocks or chunks P1, P2, P3 are generated. As will be more fully explained below, the 1 MB parity blocks P1, P2, P3 are generated using Reed-Solomon (RS) codes. While three of the parity chunks are depicted in FIG. 4, it should be recognized that more or fewer parity chunks may be calculated depending on, for example, the size of the matrix 22 and the number of inputs used.

For the sake of completeness, Reed-Solomon (RS) codes are non-binary, cyclic error-correcting codes. The RS codes provide a systematic way of building codes that can detect and correct multiple random symbol errors. By adding t check symbols to the data, an RS code can detect any combination of up to t erroneous symbols, or correct up to t/2 symbols. As an erasure code, the RS code can correct up to t known erasures, or it can detect and correct combinations of errors and erasures.

An erasure code is a forward error correction (FEC) code for a binary erasure channel, which transforms a message of k symbols into a longer message (code word) with n symbols such that the original message can be recovered from a subset of the n symbols. The fraction r=k/n is called the code rate, the fraction k'/k, where k' denotes the number of symbols required for recovery, is called reception efficiency. In addition, RS codes are suitable as multiple-burst bit-error correcting codes, since a sequence of b+1 consecutive bit errors can affect at most two symbols of size b. The choice of t is up to the designer of the code, and may be selected within wide limits.

In an embodiment, the matrix 22 of FIG. 4 is comprised of a 10×10 identity matrix (i.e., with 1's on the diagonal and 0's elsewhere) and three parity rows. As shown, one of the parity rows includes all 1's and the other two parity rows include random numbers (a20-a29 and a30-a39). In should be recognized that the matrix 22 may have other configurations in other embodiments.

Still referring to FIG. 4, to generate the 1 MB parity blocks P1, P2, P3, the 1 MB blocks of data (D0, D1, . . . D9) in the Input column 24 are applied to the matrix 22. Because a portion of the matrix 22 is an identity matrix, the same blocks of data (D0, D1, . . . D9) in the Input column 24 are also found in the Output column 26. In other words, because of the diagonal in the matrix 22, the first ten outputs in the Output column 26 mirror the inputs from the Input column 24.

As will be more fully explained below, the 1 MB blocks of data (D0, D1, . . . D9) under the Input column 24 are also applied to the matrix 22 illustrated in FIG. 4 in order to create the parity chunks P1, P2, P3. The first parity chunk, which is labeled P1, is a simple parity. Therefore, the value of P1 is calculated by applying the exclusive or (XOR) operation to D0-D9.

The second parity chunk, which is labeled P2, and the third parity chunk, which is labeled P3, are calculated by multiplying one of the inputs D0-D9 by a particular constant. In the matrix 22 of FIG. 4, the constants are represented by a letter/number combination. For example, the constants in FIG. 4 range from a20 to a29 with regard to P2 and a30 to a39 with regard to P3. The value of P2 is calculated by applying the XOR operation to the product of a20×D0, a21×D1, and so on. Likewise, the value of P3 is calculated by applying the XOR operation to the product of a30×D0, a31×D1, and so on. In an embodiment, the constants used to calculate the parity chunks P2 and P3 are random numbers.

Figure 5:
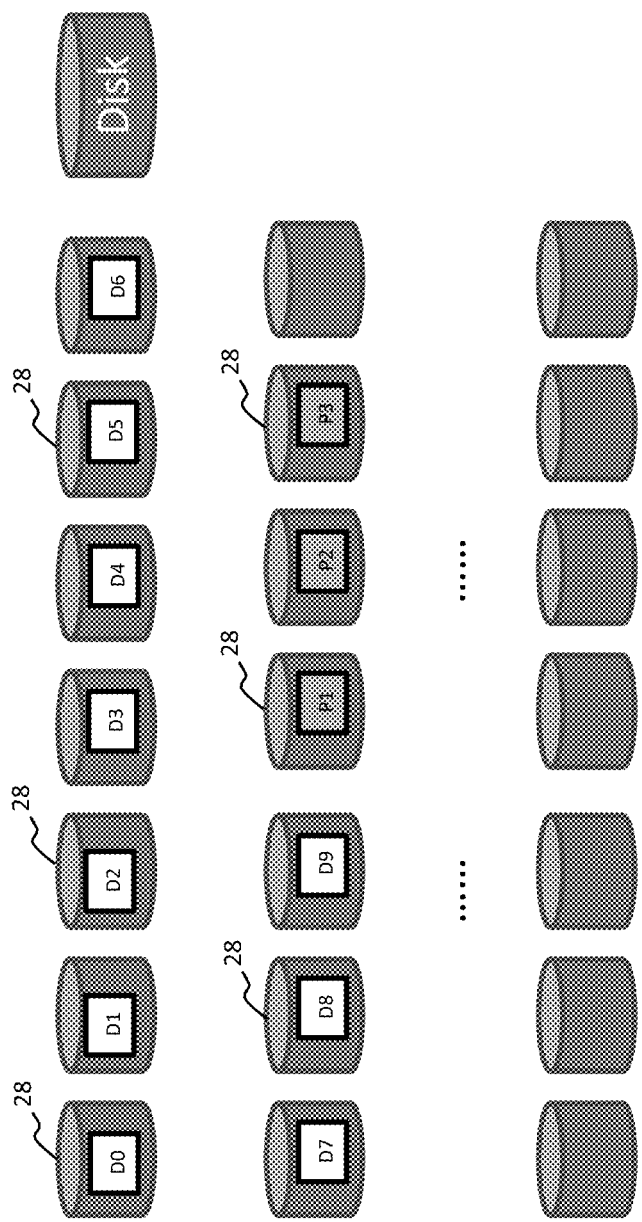
FIG. 5 illustrates a plurality of storage disks used to store the output, including the data and the parity bits.

Referring now to FIG. 5, after the 1 MB parity chunks P1, P2, P3 have been generated, the 1 MB parity chunks P1, P2, P3 and the 1 MB blocks of data (D0, D1, . . . D9) are stored in different disk nodes 28. In an embodiment, a hash is used to distribute the chunks to different disk nodes 28. In an embodiment, all the data chunks (D0, D1, . . . D9) and parity chunks P1, P2, P3 from the same super block in FIG. 3 are stored in different disk nodes 28.

Figure 6:
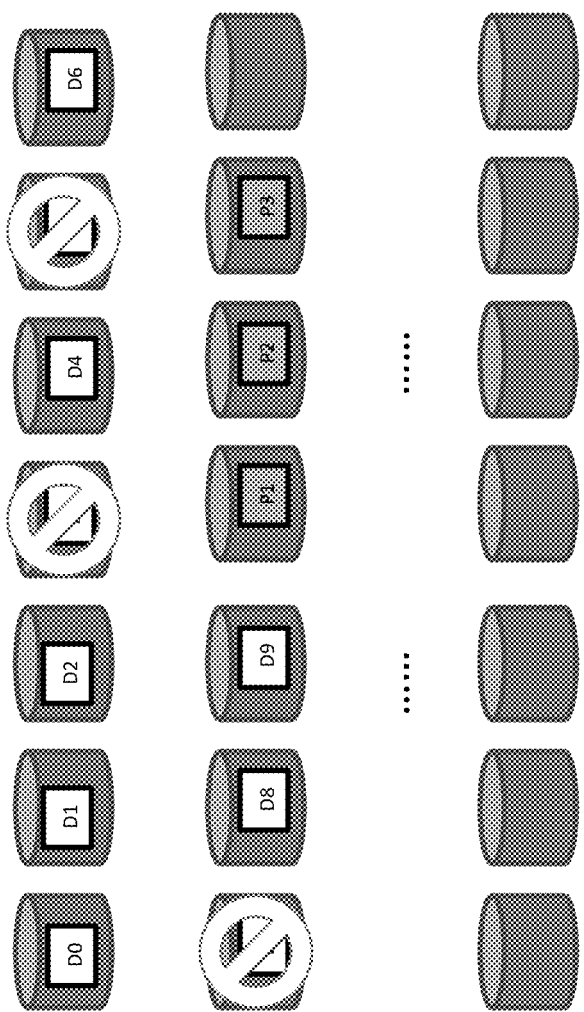
FIG. 6 illustrates a failure of several of the storage disks of FIG. 5.

Referring now to FIG. 6, if some of the 1 MB blocks of data (e.g., D3, D5, D7) are lost or rendered unrecoverable due to, for example, the failure of the disk nodes 28 storing those chunks of data, all of the 1 MB blocks of data (e.g., D0-D9) may nonetheless be recovered using the good 1 MB blocks of data (e.g., D0-D2, D4, D6, and D8-D9) and the 1 MB parity chunks P1, P2, P3. Indeed, the failed disk 28 and the information stored thereon may be recovered from the good chunks and the parity chunks using the RS codes.

Notably, in order to recover the data on the failed disk nodes 28, the number parity bits P1, P2, P3, is equal to or greater than the number of failed disk nodes 28. In the illustrative example of FIG. 6, three of the disk nodes 28 storing 1 MB blocks of data (e.g., D3, D5, D7) have failed. It should be recognized, however, than any combination of three or fewer disk nodes 28 may fail and yet still permit recovery of all the data when three parity chunks are also stored.

Figure 8:
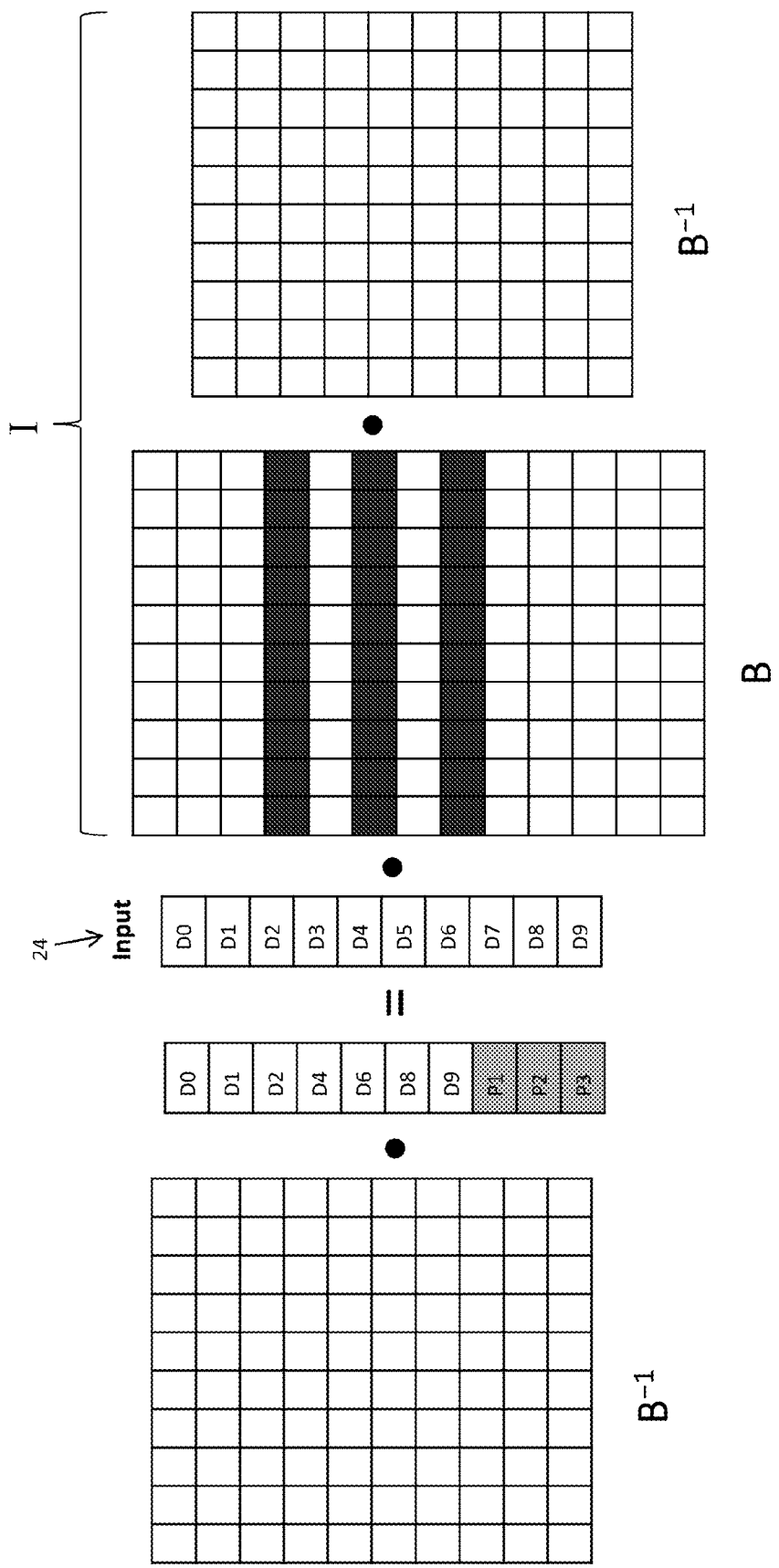
FIG. 8 is a representation of how lost data may be recovered using the parity bits.

Referring now to FIGS. 7-8, the process of recovering lost data blocks of data D3, D5, D7 due to the failure of the failed disk nodes 28 storing that data is collectively illustrated. As shown in FIG. 7, if the three rows of lost data in the matrix 22 corresponding to the 1 MB blocks of data in D3, D5, D7 (represented by the shaded rows) are removed, then the matrix 22 of FIG. 4 becomes the invertible 10×10 matrix, B. When the matrix, B, is multiplied by its inverse matrix, $B^{-1}$, the result is an identity matrix, I. Using this principle, the lost data can be recovered as illustrated in FIG. 8.

As shown in FIG. 8, the inverse matrix $B^{-1}$ is multiplied by the good data D0-D2, D4, D6, and D8-D9 and the parity bits P1, P2, P3 to generate the original input data 24 along with the identity matrix I, which is comprised of the matrix B and its inverse matrix, $B^{-1}$. Thus, the 1 MB blocks of data in D3, D5, D7 that were lost due to the failed disk nodes 28 have been recovered. With all of the 1 MB blocks of data D0-D9 now available, the blocks of data D3, D5, D7 that were lost can be re-saved to new, functioning disk nodes 28.

Unfortunately, the above system and method of recovering lost data can be very inefficient. In particular, when 1 MB chunks of data are not efficiently implemented on, for example, the current 64-bit processors from Intel. Therefore, the inventor has discovered a new method of generating erasure code in a processor-friendly manner as will be more fully explained below.

Referring back to FIG. 3, each of the 1 MB blocks is further divided into sixty-four (64) bit words when doing RS coding. These 64 bit words are intentionally sized to correspond to the 64 bit field used with the instructions used for Intel-brand or Intel-based processors. For ease of illustration, only three of the 1 MB blocks have been shown divided into sixty-four bit words. However, it should be understood that each of the 1 MB blocks are divided.

Figure 9:
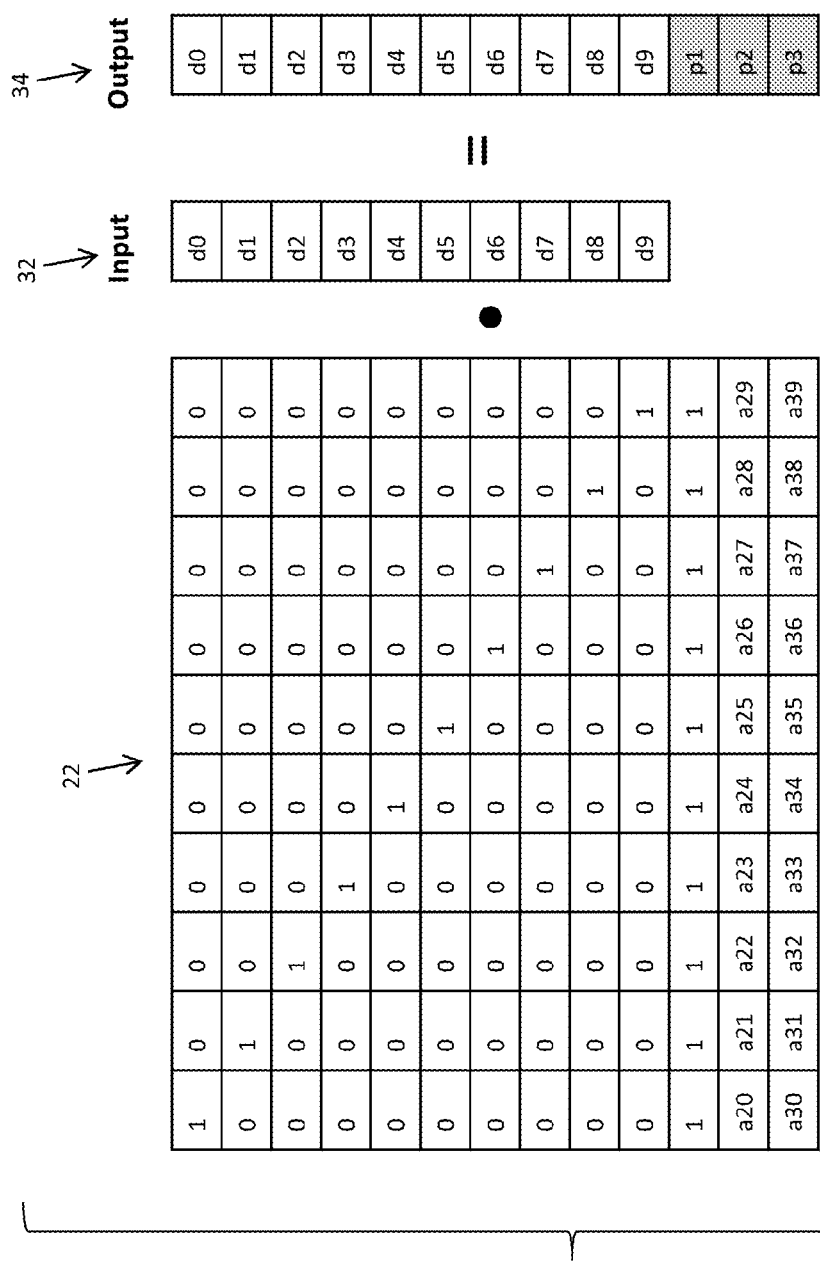
FIG. 9 illustrates a matrix used to generate 64 word parity bits from an input, the parity bits available to recover lost data.

Once the 64 bit words have been determined, they are applied to the matrix 22 as input 32 as shown in FIG. 9. When the input 32 and the matrix 22 are multiplied together the output 34 is generated. As shown, the output 34 includes the data bit words, which are labeled d0-d9, and three parity bit words, which are labeled p1, p2, p3. While three of the parity bit words are depicted in FIG. 9, it should be recognized that more or fewer parity bit words may be calculated depending on, for example, the size of the matrix 22 and the number of inputs 32 used.

As shown in FIG. 9, because of the diagonal of 1's in the matrix 22, the first ten of the outputs 34 minor the inputs 32. As will be more fully explained below, in an embodiment applying the inputs 32 to the matrix 22 to involves using Carry-less Multiplication (CLMUL) to generate parity bits in the output 32 that corresponds to, for example, a finite field.

Still referring to FIG. 9, the first parity bit word p1 is a simple parity. Therefore, the value of p1 is calculated by applying the XOR operation to d0-d9. The second parity bit word p2 and the third parity bit word p3 are calculated differently from p1. In an embodiment, the parity word bits p2, p3 are calculated using modular mathematics in order to reduce their size (e.g., from 128 bits to a suitable 64 bits). Moreover, the parity word bits p2, p3 may be calculated in three or less iterations or CLMUL calls.

With reference to FIG. 10, the first CLMUL call is initiated. The first CLMUL call involves a "d×a" multiplication (e.g., d0×a20, d0×a31, and so on). The initial result of the "d×a" multiplication will be less than or equal to 128 bits. This is due to the input, d, being one 64 word bit and the constant, a, being another 64 bit word.

As shown in FIG. 10, the initial result of the "d×a" multiplication is partitioned into two categories, a high 64 bits (H64) and a low 64 bits (L64). If the high 64 bits is equal to zero, no further steps need to be taken. This is because:

$$(a \times d) \bmod P = (H64 \times 0 \times 1\ 0000\ 0000\ 0000\ 0000 + L64) \bmod P$$

$$= L64 \bmod P$$

$$= L64$$

If the high 64 bits is not equal to zero, further operations are performed on the top half of the result, H64, in an effort to reduce the initial result to a suitable 64 bit output. In particular, a second CLMUL call is initiated as shown in FIG. 10.

The second CLMUL call involves multiplication in a finite field (a.k.a., Galois field, GF), which is multiplication modulo of an irreducible reducing polynomial to define the finite field. In an embodiment, the multiplication is in $GF(2^{64})$ using the irreducible polynomial $P(x)=x^{64}+x^4+x^3+x+1$. This characteristic polynomial may be represented as a hexadecimal number if the format P=0x1 0000 0000 0000 001b.

Prior to an explanation of the particulars of the second CLMUL call, a transformation of the formula (a×d)mod P=(H64x0x1 0000 0000 0000 0000+L64)mod P is provided to explain why "1b" is used as a multiplier. In the transformation steps, detailed below, the indication "•" refers to multiplication in $GF(2^{64})$ and the indication "*" refers to multiplication where the CLMUL may be used to obtain a result. The transformation of (a×d)mod P is as follows:

$$(a \times d) \bmod P = (H64 * 0 \times 1\ 0000\ 0000\ 0000\ 0000 + L64) \bmod P =$$

$$(H64 * 0 \times 1\ 0000\ 0000\ 0000\ 0000 + L64) \bmod P + (H64 * P) \bmod P =$$

$$((H64 * 0 \times 1\ 0000\ 0000\ 0000\ 0000 + L64) + (H64 * P)) \bmod P =$$

$$((H64 * 0 \times 1\ 0000\ 0000\ 0000\ 0000 + L64) + (H64 * P)) \bmod P =$$

$$((H64 * 0 \times 1\ 0000\ 0000\ 0000\ 0000 + L64) +$$

$$(H64 * (0 \times 1\ 0000\ 0000\ 0000\ 001b))) \bmod P,$$

where P is $0 \times 1\ 0000\ 0000\ 0000\ 001b =$ $$((H64 * 0 \times 1\ 0000\ 0000\ 0000\ 0000 + L64) +$$

$$(H64 * (0 \times 1\ 0000\ 0000\ 0000\ 0000 + H64 * 0 \times b)) \bmod P,$$

where "+" is "XOR" = $(H64 * 0 \times 1b + L64)) \bmod P$

So, as shown above, (a*d)mod P=(H64*0x1b+L64) mod P. Therefore, "1b" is used as the multiplier in the second CLMUL call.

For the second CLMUL call, the high 64 bits (H64) are multiplied by the multiplier, "1b." The second CLMUL call generates a result having 69 or less bits. Once again, the result is partitioned into two categories, a high 5 bits (H'5) and a low 64 bits (L'64) as shown in FIG. 11. Notably, if the high 5 bits are all 0's, a suitable 64 bit result is achieved (i.e., the lower 64 bits, L64) and no further steps need to be taken. If, however, the high 5 bits are not all 0's, a third CLMUL call is made.

Again, prior to an explanation of the particulars of the second CLMUL call, a transformation is helpful. The transformation of (H64*0x1b) mod P is as follows:

$$(H64 * 0 \times 1b) \bmod P = (H'5 * 0 \times 1b + L'64) \bmod P$$
$$= (H'5 * 0 \times 1b) \bmod P + L'64$$

For the third CLMUL call, the high 5 bits (H'5) are multiplied with the multiplier, namely "1b." The result is less than 64 bits. So, (H'5*0x1b) mod P=H'5*0x1b. From there, we get the following formula:

a·d=(H'5*0x1b)+L'64+L64, where "+" is XOR

So, the product of the above formula with XOR L'64 XOR L64 yields the final product of a·d.

Performing this operation forces all of the high 64 bits to be zero. Therefore, the result of the multiplication of "a×d" has been reduced to, and is represented by, the lower 64 bits (L64). This procedure of initiating three or less CLMUL calls is repeated to generate the representative product of each "a·d" (e.g., d0·a20, a31·d1, etc.).

Next, the parity bits p2, p3 shown in FIG. 9 are calculated by performing the XOR operation. For example, p2 is calculated by performing the XOR operation on "a20·d0," "a21·d1," and so on. Likewise, p3 is calculated by performing the XOR operation on "a30·d0," "a31·d1," and so on.

After the parity bits p2, p3 have been calculated, the data d0-d9 and the parity bits, p1, p2, p3 may be stored in this format or aggregated back into 1 MB blocks and stored as data D0-D9 and parity bits P1, P2, P3. Regardless, any corrupted or lost data may be recovered using the parity information as described above.

In an embodiment, the constants (e.g., a20-a29, a30-a39) are created using random numbers such that any sub-matrix is invertible. For example, in an embodiment any 3×3 sub-matrix of the matrix 22 is invertible. In an embodiment, brute force is used to determine suitable constants that will satisfy the desire for any sub-matrix to be invertible. As described above, because of the invertible quality of each 3×3 sub-matrix, the stored data is recoverable, even where up to three 1 MB blocks have been lost, corrupted, or damaged.

It should be recognized that the operations and processes noted above are generally repeated until each of the ten 1 MB blocks (from each of the 10 MB superblocks from the 1 GB data file) and the 3 MB of additional data generated from the calculation of the parity word bits is also stored in a database. In an embodiment, the 1 MB blocks and the 3 MB of additional data representing the parity word bits is stored separately in the database under different key values. As used herein, the process may be referred to as encoding the 1 GB file.

Figure 12:
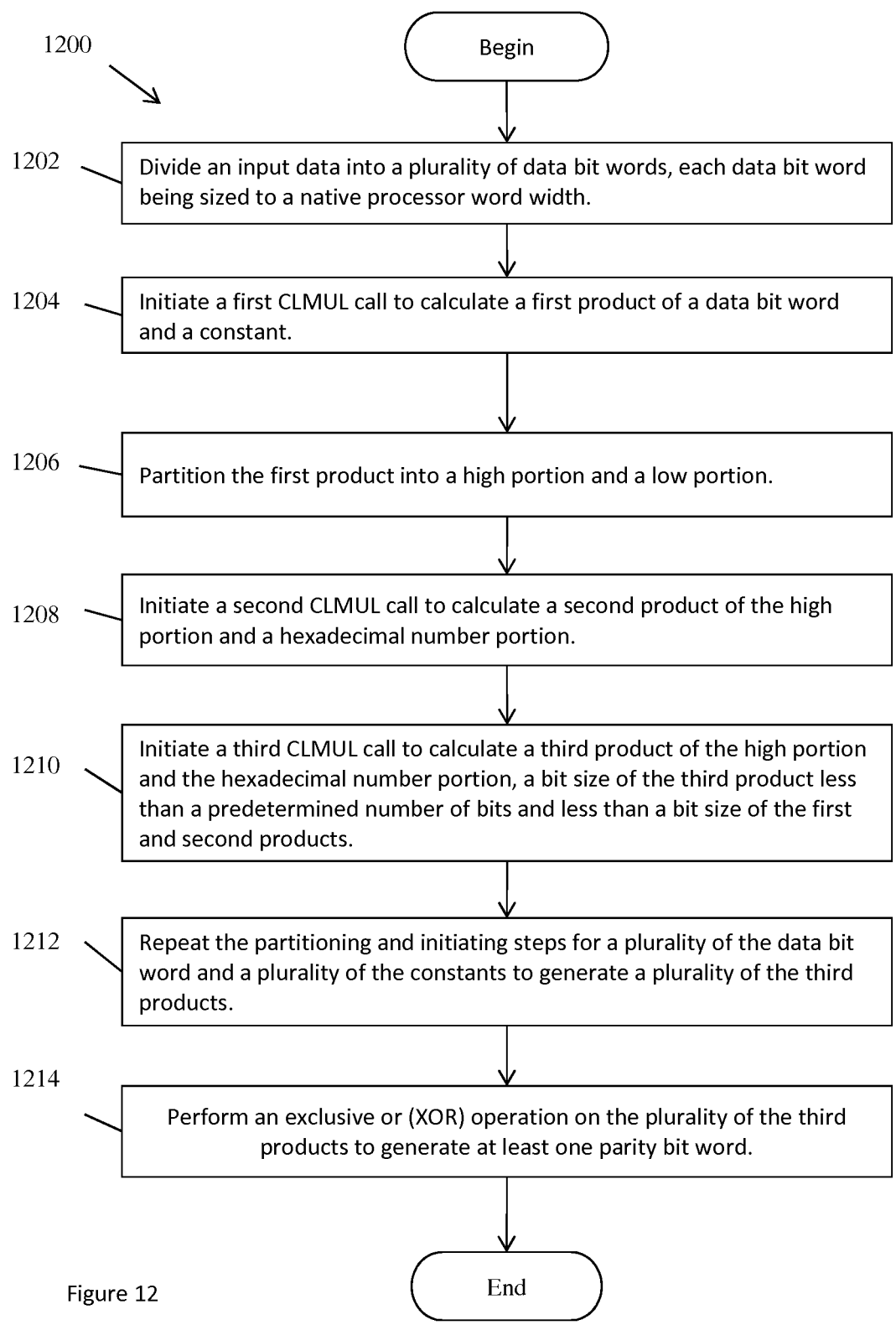
FIG. 12 illustrates a flowchart of an embodiment of a method of using Carry-less Multiplication (CLMUL) to implement erasure code.

Referring now to FIG. 12, a flowchart of an embodiment of a method 1200 of using Carry-less Multiplication (CLMUL) to implement erasure code is illustrated. The method 1200 begins at block at block 1202 where a processor divides an input data into a plurality of data bit words, each data bit word being sized to a native processor word width. At block 1204, the processor initiates a first CLMUL call to calculate a first product of a data bit word and a constant. At block 1206, the processor partitions the first product into a high portion and a low portion. At block 1208, the processor initiates a second CLMUL call to calculate a second product of the high portion and a hexadecimal number portion. At block 1210, the processor initiates a third CLMUL call to calculate a third product of the high portion and the hexadecimal number portion, a bit size of the third product less than a predetermined number of bits and less than a bit size of the first and second products. At block 1212, the processor repeats the partitioning and initiating steps for a plurality of the data bit word and a plurality of the constants to generate a plurality of the third products. At block 1214, the processor performs an exclusive or (XOR) operation on the plurality of the third products to generate at least one parity bit word, after which, the method 1200 may end.

From the foregoing, it should be recognized that the concepts disclosed herein allow for an erasure code that can be implemented more efficiently on an Intel-brand or Intel-based processor. Also, while a 64 bit processor and corresponding method have been described herein, the concepts disclosed may be scaled accordingly to accommodate a 128 bit processor, a 256 bit processor, and the like as technology advances.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of using Carry-less Multiplication (CLMUL) to implement erasure code, comprising:
   dividing, with a processor, an input data into a plurality of data bit words, each data bit word being sized to a native processor word width;
   initiating, with the processor, a first CLMUL call to calculate a first product of a first data bit word and a constant, the first data bit word being one of the plurality of data bit words;
   partitioning, with the processor, the first product into a high portion and a low portion, the low portion being sized to the native processor word width;
   initiating, with the processor, a second CLMUL call to calculate a second product of the high portion and a hexadecimal number portion, a bit size of the second product less than a bit size of the first product;
   partitioning, with the processor, the second product into a high portion and a low portion, the low portion being sized to the native processor word width;
   initiating, with the processor, a third CLMUL call to calculate a third product of the high portion of the second product and the hexadecimal number portion, a bit size of the third product less than a bit size of the second product; and
   generating, with the processor, a parity bit word of an erasure code symbol according to an exclusive or (XOR) operation on the third product, the low portion of the first product, and the low portion of the second product.

2. The method of claim 1, wherein the bit size of the third product is 64 bits or less.

3. The method of claim 1, wherein the bit size of the third product is 64 bits or less to be compatible with a 64 bit processor.

4. The method of claim 1, further comprising repeating the partitioning and initiating steps for the plurality of the data bit words and a plurality of the constants to obtain a plurality of the third products.

5. The method of claim 4, further comprising performing an exclusive or (XOR) operation on the plurality of the third products to generate at least one parity bit word.

6. The method of claim 1, wherein the bit size of the first product is less than or equal to 128 bits.

7. The method of claim 1, wherein the bit size of the second product is less than or equal to 69 bits.

8. The method of claim 1, wherein dividing the input data into a plurality of data bit words comprises dividing a one megabyte (1 MB) chunk of data to generate the plurality of data bit words.

9. The method of claim 1, further comprising creating the constant using a random number such that a matrix used to calculate a parity bit word is invertible.

10. The method of claim 1, wherein the data bit word and the constant are each 64 bits.

11. A method of using Carry-less Multiplication (CLMUL) to implement erasure code, comprising:
 dividing, with a processor, an input data into a plurality of data bit words, each data bit word being sized to a native processor word width;
 initiating, with the processor, a first CLMUL call to calculate a first product of a first data bit word and a constant, the first data bit word being one of the plurality of data bit words;
 partitioning, with the processor, the first product into a high portion and a low portion, the low portion being sized to the native processor word width;
 initiating, with the processor, a second CLMUL call to calculate a second product of the high portion and a hexadecimal number portion, a bit size of the second product less than a bit size of the first product;
 partitioning, with the processor, the second product into a high portion and a low portion, the low portion being sized to the native processor word width;
 initiating, with the processor, a third CLMUL call to calculate a third product of the high portion of the second product and the hexadecimal number portion, a bit size of the third product less than a predetermined number of bits and less than a bit size of the first product and less than a bit size of the second product;
 performing an exclusive or (XOR) operation on the third product, the low portion of the first product, and the low portion of the second product to generate a multiplication result;
 repeating the partitioning, initiating, and performing steps for the plurality of the data bit word words and a plurality of the constants to generate a plurality of the multiplication results; and
 performing an XOR operation on the plurality of the multiplication results to generate at least one parity bit word of an erasure code symbol.

12. The method of claim 11, wherein the predetermined number of bits is equal to a number of bits utilized by the processor.

13. The method of claim 11, wherein the predetermined number of bits is 64 bits.

14. The method of claim 11, wherein the at least one parity bit and the data bit words are each aggregated into one megabyte (1 MB) blocks, the 1 MB blocks distributed in storage based on a hash value.

15. The method of claim 11, wherein the hexadecimal number portion is a five bit number.

16. The method of claim 11, wherein the hexadecimal number portion is a five bit number and the constants are random numbers.

17. A server using Carry-less Multiplication (CLMUL) to implement erasure code, comprising:
 a client interface configured to receive an instruction from a client to store data; and
 a processor in communication with the client interface, the processor configured to perform the following in response to the instruction:
  divide an input data into a plurality of data bit words, each data bit word being sized to a native processor word width;
  initiate a first CLMUL call to calculate a first product of a first data bit word and a constant, the first data bit word being one of the plurality of data bit words;
  partition the first product into a high portion and a low portion, the low portion being sized to the native processor word width;
  initiate a second CLMUL call to calculate a second product of the high portion and a hexadecimal number portion, a bit size of the second product less than a bit size of the first product;
  partition the second product into a high portion and a low portion, the low portion being sized to the native processor word width; and
  initiate a third CLMUL call to calculate a third product of the high portion of the second product and the hexadecimal number portion, a bit size of the third product less than a bit size of the second product and equal to a bit size used by the processor; and
  generating a parity bit word of an erasure code symbol according to an exclusive or (XOR) operation on the third product, the low portion of the first product, and the low portion of the second product.

18. The server of claim 17, wherein the processor is configured to repeat the first, second and third CLMUL calls and perform an exclusive or (XOR) operation on a plurality of the third products generated thereby to generate a plurality of parity bit words.

* * * * *